(12) United States Patent
Kusukawa et al.

(10) Patent No.: US 6,504,110 B1
(45) Date of Patent: Jan. 7, 2003

(54) INSULATING CIRCUIT BOARD AND POWER SEMICONDUCTOR APPARATUS EMPLOYING THE SAME

(75) Inventors: Junpei Kusukawa, Hitachi (JP); Ryozo Takeuchi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 103 days.

(21) Appl. No.: 09/655,488

(22) Filed: Sep. 5, 2000

(30) Foreign Application Priority Data

Dec. 20, 1999 (JP) .......................... 11-360357

(51) Int. Cl.[7] .............................. H01R 9/09
(52) U.S. Cl. ..................... 174/261; 29/846; 29/847; 228/24; 257/692
(58) Field of Search .................. 174/261; 29/846, 29/847; 257/692; 228/24; 427/96; 438/761

(56) References Cited

U.S. PATENT DOCUMENTS

| | | | | |
|---|---|---|---|---|
| 4,752,118 A | * | 6/1988 | Johnson | 228/24 |
| 5,340,617 A | * | 8/1994 | Fasano et al. | 427/96 |
| 5,834,321 A | * | 11/1998 | Salisbury | 438/761 |

FOREIGN PATENT DOCUMENTS

JP         402089654    *  3/1990    ............ 347/208

OTHER PUBLICATIONS

Japanese Patent Unexamined Publication No. 5–152461 Jun. 18, 1993.
Japanese Patent Examined Publication No. 7–77989 Aug. 23, 1995.

* cited by examiner

Primary Examiner—Albert W. Paladini
(74) Attorney, Agent, or Firm—Antonelli, Terry, Stout & Kraus, LLP

(57) ABSTRACT

In order to restrict a local concentration of an electric field in a conductor layer end portion of an insulating circuit board and increase a partial electric discharge starting voltage, thereby improving an insulating reliability of the insulating circuit board and a power semiconductor apparatus employing the same, the present invention provides a method of manufacturing a insulating circuit board comprising the step of applying a voltage between the circuit patterns of the insulating circuit board in an atmospheric or depressurized gas so as to allow the circuit board to discharge electricity, or irradiating a laser beam, thereby a projection shape of the end portion of the electrode conductor is melted and smoothened so as to restrict the concentration of the electric field.

23 Claims, 10 Drawing Sheets

(CROSS SECTIONAL VIEW)

(CROSS SECTIONAL VIEW)

(TOP VIEW)

CURVATURE RADIUS r≦3 μm (ENLARGED CROSS SECTIONAL VIEW OF ELECTRODE END PORTION)

DIFFERENCE BETWEEN CAPE AND RECESS d≧50 μm (ENLARGED TOP VIEW OF ELECTRODE END PORTION)

(CROSS SECTIONAL VIEW)

(TOP VIEW)

CURVATURE RADIUS r≧3 μm (ENLARGED CROSS SECTIONAL VIEW OF ELECTRODE END PORTION)

DIFFERENCE BETWEEN CAPE AND RECESS d≦50 μm (ENLARGED TOP VIEW OF ELECTRODE END PORTION)

RELATION BETWEEN CURVATURE RADIUS AND PARTIAL
ELECTRIC DISCHARGE STARTING VOLTAGE

RELATION BETWEEN DIFFERENCE BETWEEN CAPE AND RECESS AND PARTIAL ELECTRIC DISCHARGE STARTING VOLTAGE

RELATION BETWEEN NUMBER OF ELECTRIC DISCHARGE PER 1 CYCLE WHEN APPLYING ALTERNATING VOLTAGE AND PARTIAL ELECTRIC DISCHARGE STARTING VOLTAGE

RELATION BETWEEN NUMBER OF ELECTRIC DISCHARGE PER 1 SECOND WHEN APPLYING DIRECT VOLTAGE AND PARTIAL ELECTRIC DISCHARGE STARTING VOLTAGE

RELATION BETWEEN AIR PRESSURE AND ELECTRIC DISCHARGE MINIMUM VOLTAGE

EFFECT THAT ELECTRIC DISCHARGE UNDER VARIOUS PRESSURE GIVES TO PARTIAL ELECTRIC DISCHARGE STARTING VOLTAGE

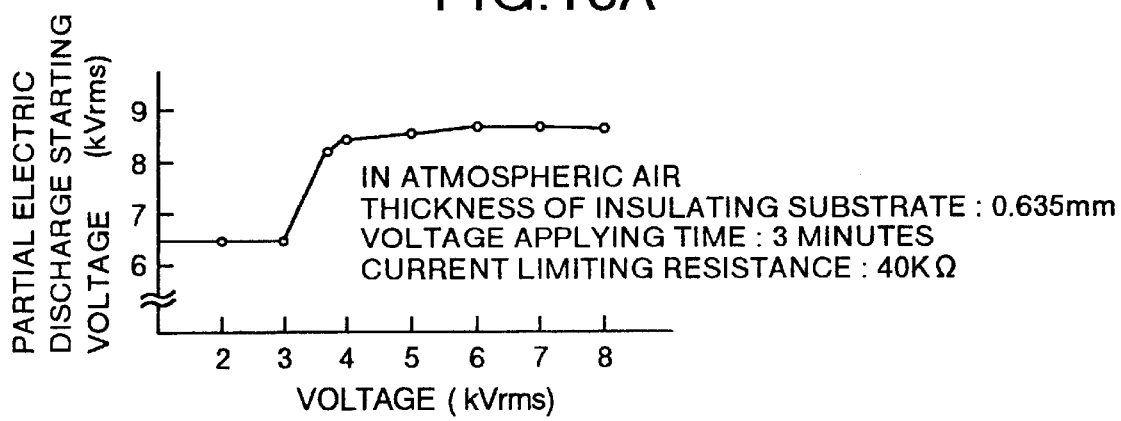
EFFECT THAT APPLYING VOLTAGE GIVES TO PARTIAL ELECTRIC DISCHARGE STARTING VOLTAGE
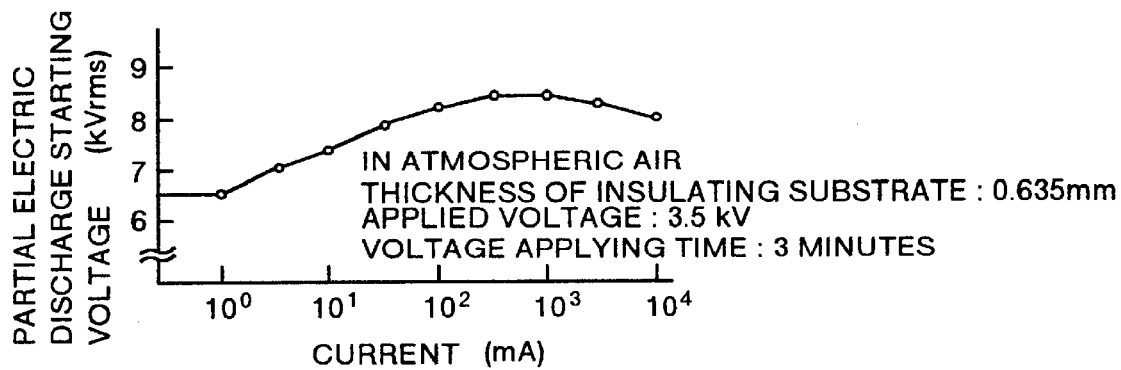
EFFECT THAT ELECTRIC DISCHARGE CURRENT GIVES TO PARTIAL ELECTRIC DISCHARGE STARTING VOLTAGE
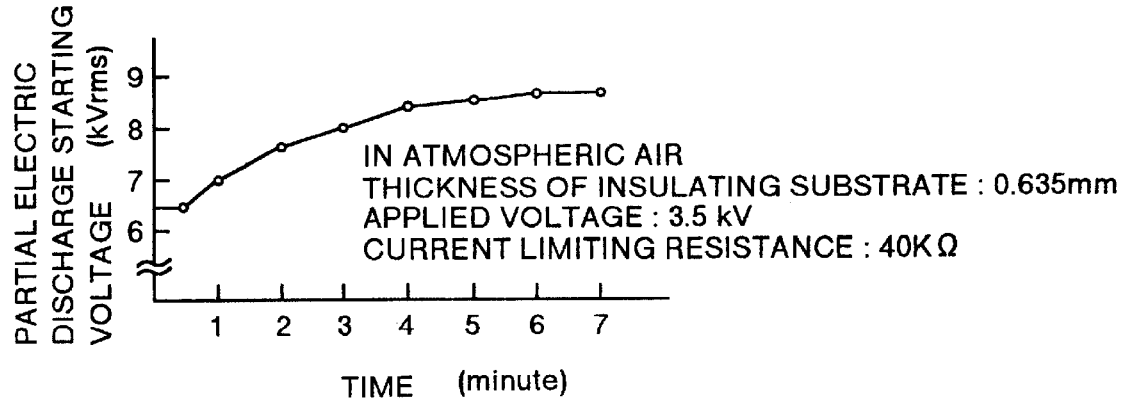
EFFECT THAT TREATING TIME GIVES TO PARTIAL ELECTRIC DISCHARGE STARTING VOLTAGE

INSULATING CIRCUIT BOARD AND POWER SEMICONDUCTOR APPARATUS EMPLOYING THE SAME

BACKGROUND OF THE INVENTION

1. Field of the Invention

The present invention relates to a method of manufacturing an insulating substrate which can secure an insulation within a package such as a power semiconductor apparatus, and more particularly to an insulating circuit board intended to improve an insulating property of a composite member comprising an insulating substrate and an electrode conductor bonded to the insulating substrate by a bonding member, and a power semiconductor apparatus employing the insulating circuit board.

2. Description of the prior Art

Conventionally, there has been known a semiconductor apparatus which is composed by sealing a semiconductor device, such as an IGBT, a diode, a GTO, a transistor or the like, within an insulating container. The apparatus is applied to various kinds of inverter apparatus or the like in accordance with its voltage resistance property and its current capacity. The apparatus is composed so as to insulate an electric circuit from a base via an insulating substrate such as an alumina ($Al_2O_3$), an aluminum nitride (AlN) or the like within the apparatus, thereby apparatus. In particular, in the insulation between the base and the electric circuit, a withstand voltage in 10 kV class has become required. In order to solve the requirement, an average electric field strength is reduced by, in general, a method of increasing a thickness of the insulating substrate so as to reduce the electric field strength, or a method of increasing a creepage distance between the circuit pattern and an end portion of the insulating substrate.

SUMMARY OF THE INVENTION

In order to improve the withstand voltage, it is necessary to reduce a local electric field strength which causes an insulation deterioration. In many cases of using the insulating circuit board in the semiconductor apparatus, a whole of the insulating circuit board is covered with an organic resin such as a silicone gel. In the structure covered with the resin, a partial electric discharge is generated in an electric field concentrating portion having a local great electric field strength as a precursor phenomenon of a dielectric breakdown, thereby a void or an electric tree is generated. In the case that a voltage is continuously charged, the electric discharge is continuously generated, so that there is a risk that the tree grows to generate the dielectric breakdown. In the case that a voltage is applied within the semiconductor apparatus, a place in which the electric improving easiness of mounting. Among these devices, the IGBT has advantages of an easy control and a high frequency operation with a great amount of current, since the IGBT is a voltage control type device. In recent years, the IGBT device is developed to have a great capacity, so that the performance thereof is improved up to a field covered by the conventional GTO. In accordance with the increase of the capacity of the apparatus, an area of the insulating substrate used within the apparatus becomes large due to an increase of size and an increases of the number of chips of the semiconductor device used within the apparatus. In order to solve the problem of the increase of the area, there has been employed a method of providing a terraced portion (a step portion) in an end portion of a conductive layer bonded to the insulating substrate as shown in Japanese Patent Publication No. 5-152461, a method of placing an end portion of a bonding member for bonding a electrode conductor and an insulating substrate outside the electrode conductor as shown in Japanese Patent Publication No. JP-B2-7-77989, or the like. These methods reduce a maximum stress generated in the electrode conductor or between the bonding member and the insulating substrate so that a crack generated by a heat cycle of the insulating substrate is restricted. Further, it is necessary to increase a withstand voltage within the apparatus in correspondence to a high withstand voltage of the field is concentrated is in a creepage portion of the insulating circuit board, more particularly a terminal end portion of the electrode conductor in the creepage portion of the insulating substrate. However, in the method of making the shape of the electrode conductor terminal end portion thin and the method of arranging the bonding member outside the electrode conductor which are employed as a countermeasure against the crack of the insulating substrate in the prior art mentioned above, no consideration is given to a relation between the shape of the terminal end portion of the electrode conductor and the partial electric discharge starting voltage, between the electrode conductors (in the case of applying a voltage between the electrodes in the circuit side) and between the electrode conductor and the electrode on a back surface of the insulating substrate (in the case of applying a voltage between the electric circuit and the base).

On the contrary, in the method of making the insulating substrate thick in order to reduce the average electric field strength, since the heat conduction of the insulating substrate is smaller than that of the electrode conductor (for example, a thermal conductivity coefficient of a copper generally used as an electrode conductor is 398 W/mK and on the contrary, those of an alumina and AlN used as an insulating substrate are 36 W/mK and 175 W/mK respectively, which are one half or less of that of a copper), a heat resistance of the apparatus is increased. Further, the method of increasing the creepage distance so as to improve the withstand voltage makes the apparatus large.

It is an object of the present invention to provide an insulating circuit board having a high withstand voltage (corresponding to a partial electric discharge starting voltage and a breakdown voltage), and to provide a power semiconductor apparatus having a high insulting reliability by using the insulating circuit board.

In order to achieve the object mentioned above, according to the present invention, there is provided a method of manufacturing an insulating circuit board having an insulating substrate, and an electrode conductor bonded to a surface of the insulating substrate by a bonding member to form a circuit pattern on the surface of the insulating substrate, comprising the step of allowing a conductor end portion of the circuit pattern to discharge electricity in an atmospheric or depressurized gas so as to melt and re-solidify the conductor end portion of the circuit pattern.

In the method, an alternating voltage may be applied to the circuit pattern in an atmospheric or depressurized gas so as to allow the conductor end portion to discharge electricity at substantially each of cycles.

Otherwise, a direct voltage may be applied to the circuit pattern in the atmospheric or depressurized gas so as to allow the conductor end portion to discharge electricity at one or more times per one second.

In the case of allowing the conductor end portion to discharge electricity in an atmospheric or depressurized gas, a voltage may be applied to the circuit pattern by using a circuit having a resistance connected to the circuit pattern in series so as to allow the conductor end portion to discharge electricity.

Otherwise, the conductor end portion of the circuit pattern may be melted and re-solidified by laser beam irradiation.

As a result of these methods, the temperature rises due to an electric discharge energy in a portion in which an electric discharge is generated by a concentration of an electric field due to an acute angle shape in the end portion of the electrode conductor, or due to an energy of the laser in the laser irradiated portion, thereby the conductor metal in the end portion of the electrode conductor is melted so as to deform the acute angle shape in the end portion of the electrode conductor and form a smooth shape. In particular, in the case of viewing an upper surface of the insulating circuit board, uneven portions (comprising capes and recesses) having the acute angle shape in the end portion of the electrode conductor are reduced by the melting and re-solidifying, and in the case of viewing a cross section of the insulating circuit board, a curvature radius of a projection shape in the end portion of the electrode conductor is enlarged by the melting and re-solidifying. As a result, it is possible to prevent the electric field form concentrating in the end portion of the electrode conductor, so that the starting voltage for generating the partial electric discharge is increased.

Since it is possible to generate an electric discharge at the voltage lower than the withstand voltage of the semiconductor device by applying the voltage in the atmospheric and depressurized gas, it is possible to apply the voltage and generate the electric discharge even at a time of assembling the semiconductor apparatus as well as the sole insulating circuit board. In that case, the voltage may be applied and electrically discharged before coating an organic resin such as a silicone gel or the like. Further, since the electric discharge energy is concentrated near the electric discharge portion even in the case of the electric discharge at a relatively low voltage, it is possible to obtain an effect sufficient to melt and deform the conductor metal.

A description will be given below of an embodiment in accordance with the present invention and a comparative embodiment with reference to the accompanying drawings.

BRIEF DESCRIPTION OF THE DRAWINGS

FIGS. 13A, 13B and 13C are views which show examples of various kinds of processing conditions and effects thereof (the partial electric discharge starting voltage) in accordance with an embodiment of the present invention.

DETAILED DESCRIPTION OF THE INVENTION

Figure 1:
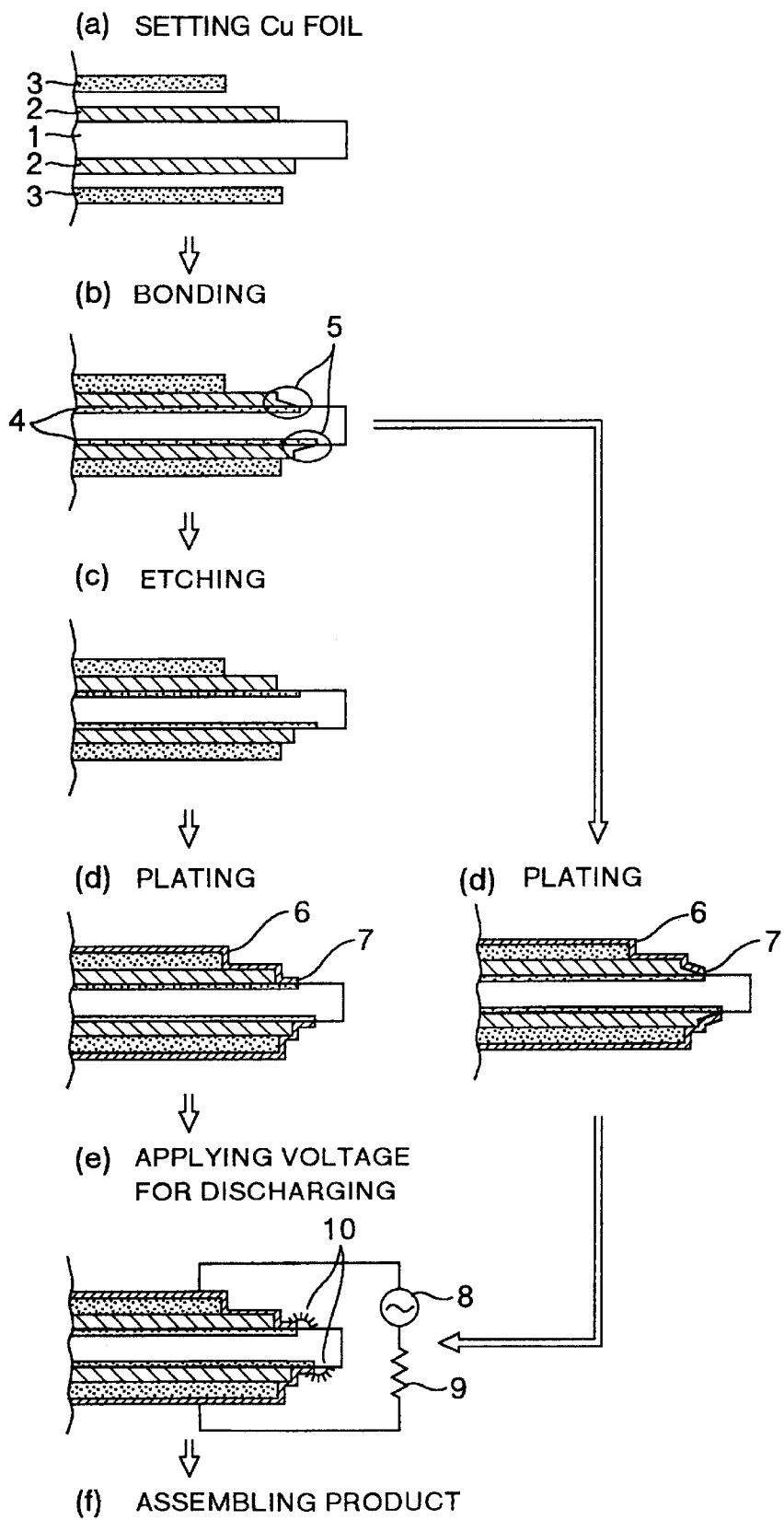
FIG. 1 is a schematic view which shows a manufacturing process for explaining an embodiment in accordance with the present invention.

FIG. 1 shows a method of manufacturing an insulating circuit board in accordance with an embodiment of the present invention. The manufacturing process in accordance with the present embodiment has steps (a) to (e) shown in FIG. 1. At first, in a step (a), in order to bond an electrode board 3 made of a Cu foil to an AlN insulating substrate 1, a brazing member 2 made of Cu—Ag—Ti alloy, for example, is applied in accordance with a pattern printing. Next, in a step (b), after setting the Cu foil 3, a bonding operation is performed by thermally treating at about 800° C. while applying a load by a weight or the like. At a time of heat treatment, the N contained in the AlN insulating circuit board 1 and the Ti contained in the Cu—Ag—Ti alloy brazing member 2 are reacted to produce a TiN reaction layer 4. The TiN reaction layer 4 is also formed in a portion of a brazing member 5 melting and flowing out from the first printing area of the Cu—Ag—Ti alloy brazing member 2. In the substrate having a little amount of brazing member 5 flowing out, a Ni plating 6 in a step (d) is applied as it is. Further, in the substrate having a lot of brazing member 5 flowing out, the conductor layer portion required for improving a heat cycle resistance is masked and the flowing out brazing member 5 is etched and removed. At this time, since an etching speed is different between the Cu—Ag—Ti alloy brazing member 2 and the Ti—N reaction layer 4, there is a case that the reaction layer is left. In the structure mentioned above, when the Ni plating 6 in the step (d) is applied, the Ni plating 6 is partially attached onto the TiN reaction layer 4, so that a thin layer 7 constituted only by the Ni plating is formed in the conductor terminal end.

Hereinafter, the insulating circuit board produced by the steps (a) to (d) is referred as a comparative embodiment.

Figure 2A:
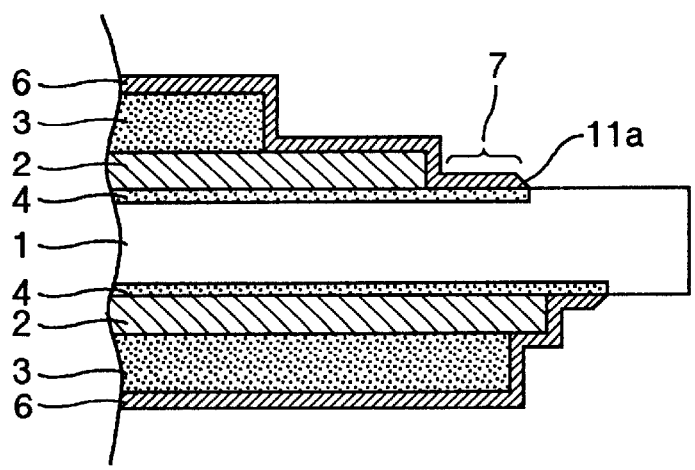
FIG. 2A is a cross sectional view of an insulating circuit board in accordance with a comparative embodiment.
Figure 2B:
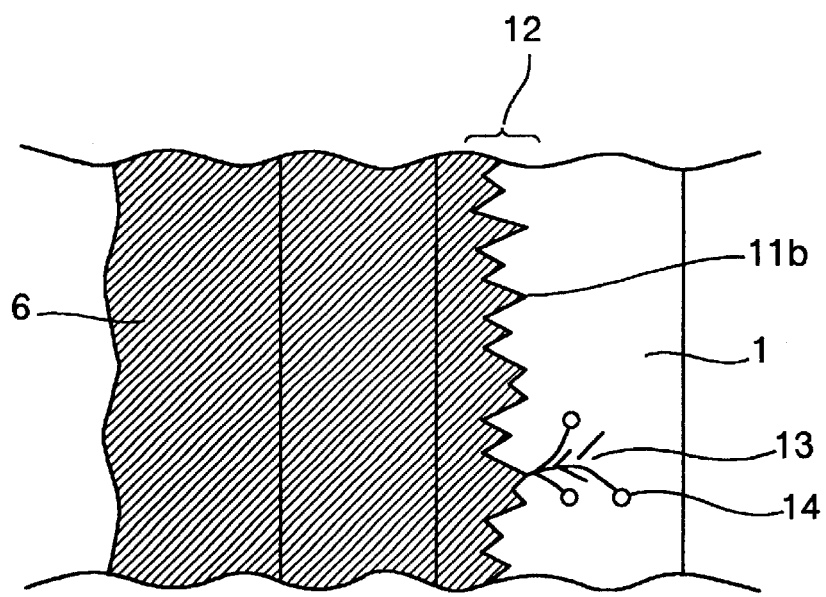
FIG. 2B is a plan view of the insulating circuit board in accordance with the comparative embodiment.
Figure 3A:
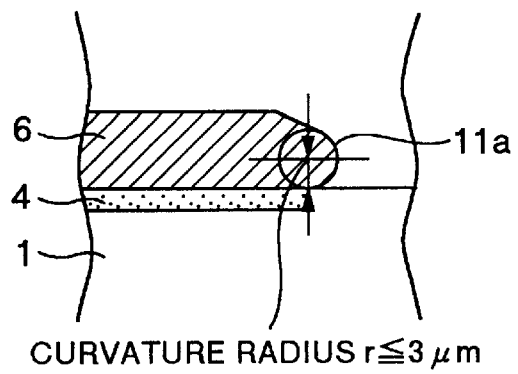
FIG. 3A is an enlarged cross sectional view of an end portion of an electrode conductor of the insulating circuit board in accordance with the comparative embodiment.
Figure 3B:
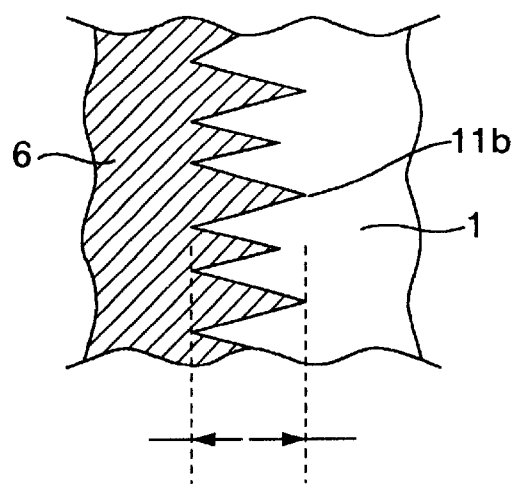
FIG. 3B is an enlarged top elevational view of the end portion of the electrode conductor of the insulating circuit board in accordance with the comparative embodiment.

FIGS. 2A and 2B show the comparative embodiment, that is, the insulating circuit board obtained after the step (d), and FIGS. 3A and 3B show an enlarged view of the end portion of the conductor electrode of the insulating circuit board. In those figures, FIGS. 2A and 3A are cross sectional views of he insulating circuit board and FIGS. 2B and 3B are plan views of the insulating circuit board as viewed from an upper portion. In accordance with the step (d), the Ni plating 6 is also partially attached onto the TiN reaction layer 4, and the thin layer 7 constituted only the Ni plating is formed in the end portion of the conductor electrode. As viewing the end portion of the conductor electrode in detail, there is a case that a curvature radius of an end portion 11a of a conductor electrode at a distal end in the thin layer constituted only by the Ni plating is 3 µm or less, for example, as shown in FIG. 3A. The top elevational view in FIG. 2B shows a shape of a portion in which the brazing member flows out. A shape of the brazing member terminal end is determined by the flowing out of the brazing member and an etched shape. Accordingly, it is hard to form a flat shape with evenness, so that the end portion of the conductor electrode becomes an unevenness 12 having a projection shape 11b, for example. For example, there is a case that a difference "d" between a cape and a recess of the uneven portion in the end portion of the conductor electrode is 50 µm or more, as shown in FIG. 3B. When assembling the insulating circuit board having the electrode in the shape mentioned above into the semiconductor apparatus and applying a test voltage thereto, a partial electric discharge is generated from a portion such as the projection-shaped distal end 11a or the like of the end portion of the conductor electrode in which an electric field is concentrated. Accordingly, there is a possibility that a tree 13 and a void 14 is generated in the organic seal resin such as a silicone gel or the like and a deterioration is promoted. Here, the test voltage means a maximum voltage applied in a withstand voltage test or the like performed before shipping the products.

In a method in accordance with an embodiment of the present invention, a step (e) in FIG. 1 is added. That is, before assembling the insulating circuit board into the semiconductor apparatus, a voltage is applied to the circuit pattern in the atmospheric air or the pressure reduced gas so as to allow the circuit pattern to discharge electricity 10 by using a power source 8, and an acute shape of the end portion of the conductor electrode is melted and re-solidified by the electric discharge energy, thereby being smoothly deformed. In this case, a resistance connected to the circuit pattern in series restricts an electric discharge current flowing at a time of the electric discharge, and is used for preventing a short circuit phenomenon (and a carbonized conductive passage formation due to the short circuit) between the circuit patterns due to the electric discharge and controlling a melting degree of the end portion of the conductor electrode.

Figure 4A:
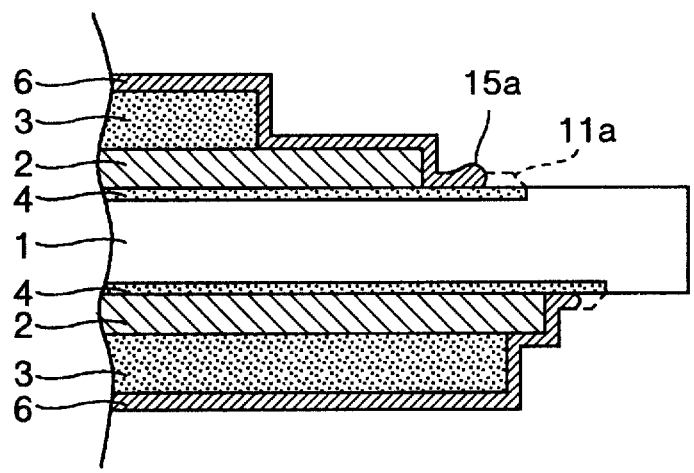
FIG. 4A is a cross sectional view of an insulating circuit board in accordance with an embodiment to which the present invention is applied.
Figure 4B:
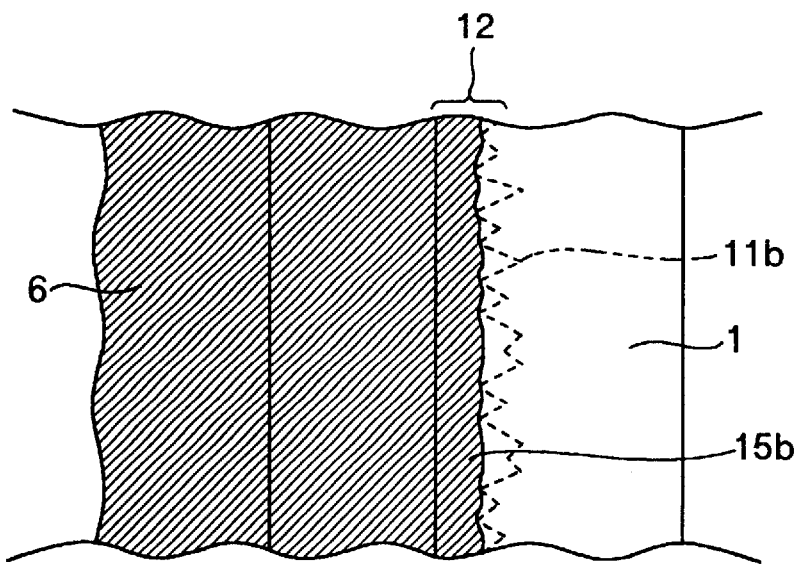
FIG. 4B is a plan view of the insulating circuit board in accordance with the embodiment to which the present invention is applied.
Figure 5A:
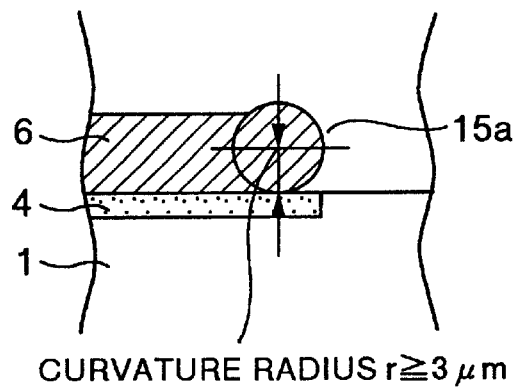
FIG. 5A is a enlarged cross sectional view of an end portion of an electrode conductor of the insulating circuit board in accordance with the embodiment to which the present invention is applied.
Figure 5B:
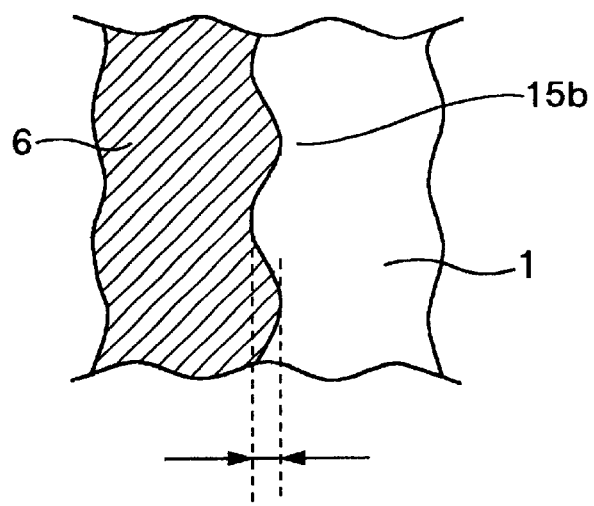
FIG. 5B is an enlarged top elevational view of the end portion of the electrode conductor of the insulating circuit board in accordance with the embodiment to which the present invention is applied.
Figure 6:
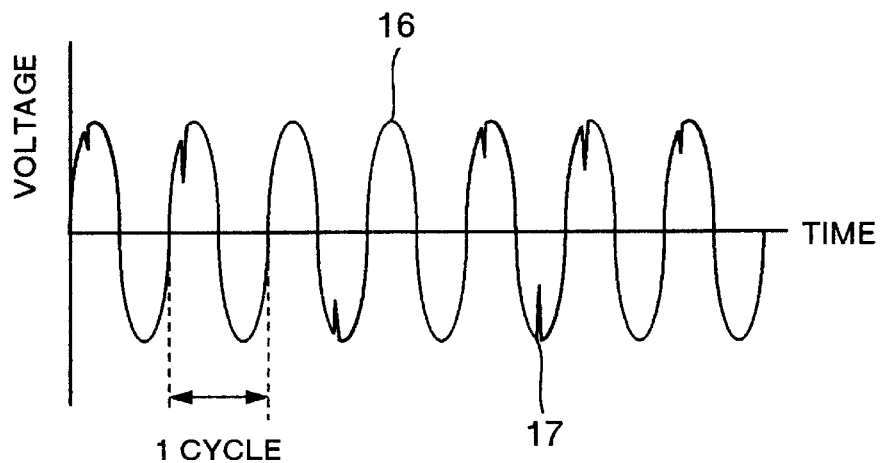
FIG. 6 is a view which shows an example of a voltage waveform when an alternating voltage is applied to a circuit pattern on the insulating circuit board and electrically discharged therefrom in accordance with the embodiment of the present invention.

FIGS. 4A and 4B show an insulating circuit board in accordance with an embodiment of the present invention, and FIGS. 5A and 5B show an enlarged view of the end portion of the conductor electrode thereof. In those figures, FIGS. 4A and 5A are cross sectional views of the insulating circuit board and FIGS. 4B and 5B are plan views of the insulating circuit board as viewed from an upper portion. Further, FIG. 6 shows an example of a voltage waveform obtained by applying an alternating voltage 16 having a commercial power source frequency (50 Hz) to the circuit pattern of the insulating circuit board in accordance with the present invention so as to electrically discharge at substantially each of cycles. Here, one cycle means one period in the alternating voltage. In accordance with the present invention, an alternating voltage 16 is applied between the patterns on the insulating circuit board or between the patterns on the front side and the back side of the insulating circuit board so as to allow the circuit pattern to discharge electricity 17 at substantially each of cycles as shown in FIG. 6, thereby projection shapes 11a and 11b of the end portions of the conductor electrode are melted and re-solidified by the electric discharge energy so as to be smoothened. (In the case of the insulating substrate having a thickness of 0.635 mm, an alternating voltage of 3 kV to 5 kV is applied between the front and back electrodes for a thirty seconds to five minutes so as to electrically discharge at substantially each of cycles. In the case that the applied voltage is small and the electric discharge frequency is a little, the effect becomes reduced.) That is, in an enlarged cross sectional view in FIG. 5A, the curvature radius of the end portion 11a of the conductor electrode is increased in comparison with the insulating circuit board in accordance with the comparative embodiment in FIG. 3A, for example, it is set to be equal to or more than 3 µm as denoted by reference symbol 15a. In a plan view in FIG. 4B, the unevenness 12 in the end portion of the conductor electrode, which has the projection shape 11b, is reduced so as to form a smooth shape as denoted by reference symbol 15b. In particular, as shown in FIG. 5B, the structure is formed such that the difference "d" between the cape and the recess of the end portion of the conductor electrode is equal to or less than 50 µm.

Figure 7:
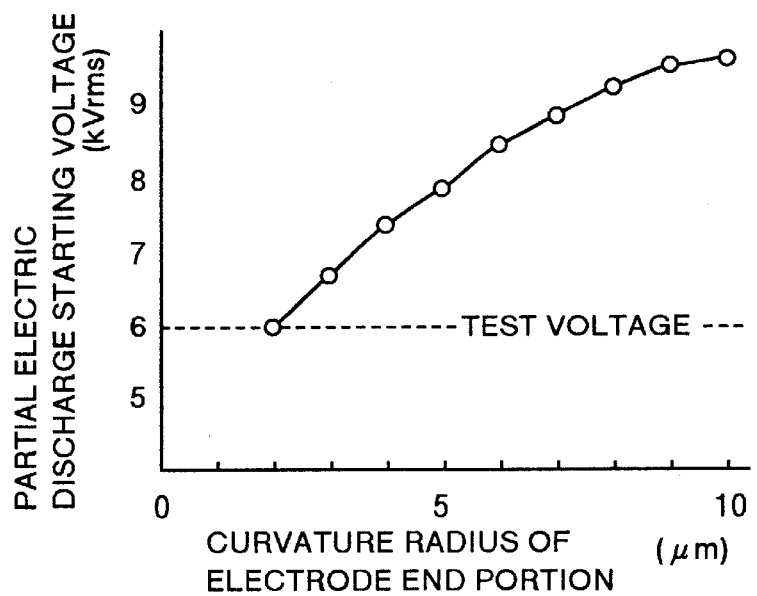
FIG. 7 is a view which shows a relation between a curvature radius of the electrode end portion and a partial electric discharge starting voltage.

FIG. 7 shows a relation between a curvature radius of the electrode end portion and a partial electric discharge starting voltage. When realizing the present invention and setting the curvature radius of the electrode end portion to be 3 µm or more, the partial electric discharge starting voltage is improved and no partial electric discharge is generated in a test voltage. Accordingly, the curvature radius of the electrode end portion is preferably set to be 3 µm or more. Further, the larger the curvature radius of the electrode end portion is made as shown in FIG. 7, the more the electric field concentration is reduced, so that the partial electric discharge starting voltage is improved. Accordingly, more preferably, the curvature radius of the electrode end portion is set to be 5 µm or more.

Figure 8:
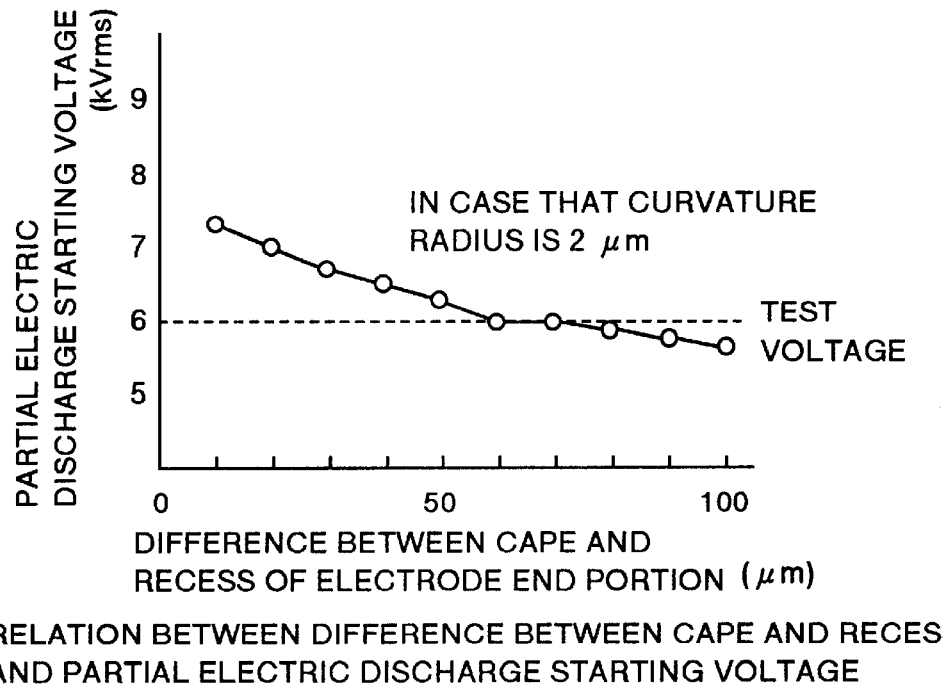
FIG. 8 is a view which shows a relation between a difference between a cape and a recess in a projection of an electrode end portion and a partial electric discharge starting voltage.

FIG. 8 shows a relation between the difference between the cape and the recess in the projection portion of the electrode end portion and the partial electric discharge starting voltage. When setting the difference between the cape and the recess in the projection portion of the electrode end portion to be 50 µm or less, the partial electric discharge starting voltage is improved and no partial electric discharge is generated in the test voltage. Accordingly, it is desirable to set the difference between the cape and the recess of the projection portion of the electrode end portion to be 50 µm or less. Further, the smaller the difference between the cape and the recess in the projection portion of the electrode end portion is made as shown in FIG. 8, the more the partial electric discharge starting voltage is improved. Accordingly, more desirably, it is set to be 30 µm or less.

As mentioned above, in accordance with the present embodiment, since the shape of the electrode end portion becomes smooth by being melted and re-solidified due to the electric discharge, it is possible to reduce the concentration of the electric field in the end portion of the conductor electrode and the local strength of the electric field, whereby it is possible to increase the partial electric discharge starting voltage.

It is not limited to the alternating voltage having the commercial power source frequency (50 Hz or 60 Hz) to melt the end portion of the conductor electrode by using the electric discharge energy, and the same effects can be obtained by the alternating voltage having any frequency or by a direct voltage application.

Figure 9:
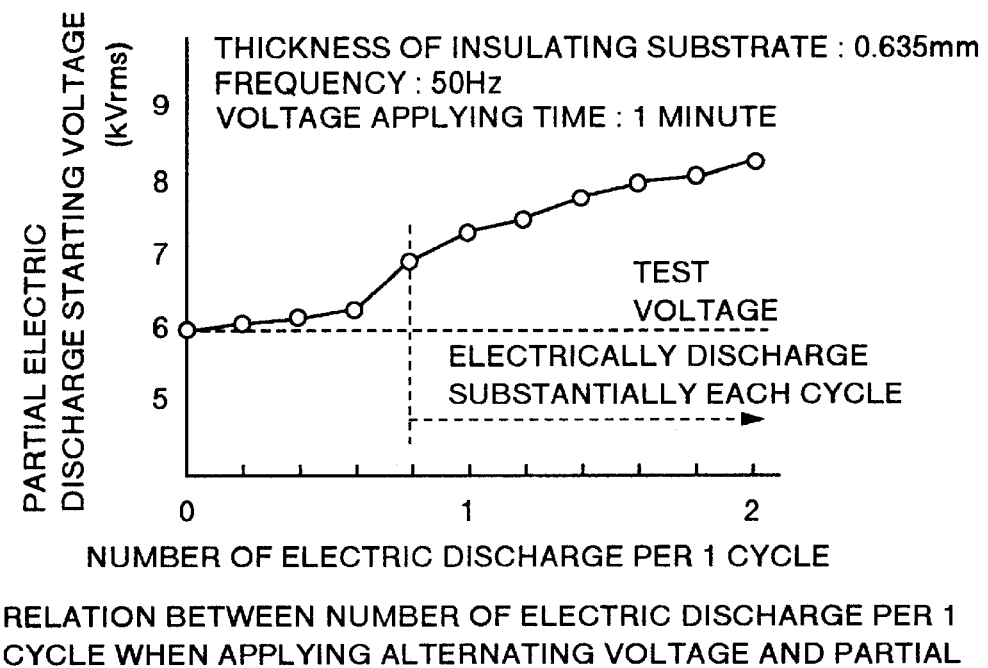
FIG. 9 is a view which shows a relation between the number of electric discharge per one cycle and the partial electric discharge starting voltage when applying the alternating voltage.
Figure 10:
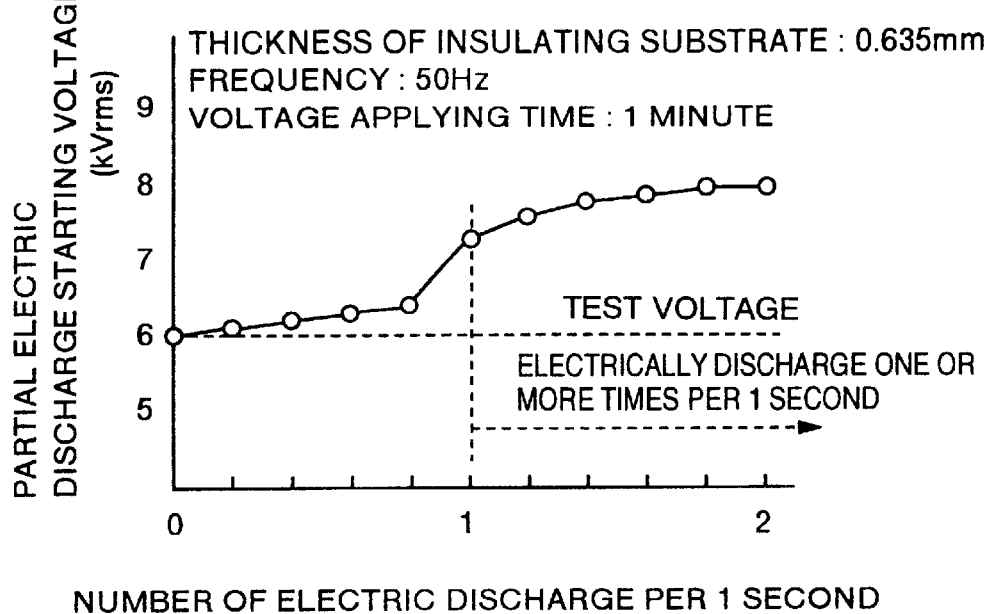
FIG. 10 is a view which shows a relation between the number of electric discharge per one second and the partial electric discharge starting voltage when applying a direct voltage.

FIG. 9 shows a relation between the electric discharge frequency and the treated result (the partial electric discharge starting voltage) by applying the alternating voltage application, and FIG. 10 shows a relation between the number of the electric discharge per one second and the treated result (the partial electric discharge starting voltage) by applying the direct voltage application. As shown in FIG. 9, in the case of the alternating voltage, the partial electric discharge starting voltage is improved by discharging, however, in order to obtain the effect, it is desirable to electrically discharge 0.2 times or more per one cycle. More desirably, it is preferable to electrically discharge at substantially each cycle (which means 0.8 times or more per one cycle). Further, in the case of the direct voltage, the partial electric discharge starting voltage is improved as shown in FIG. 10 by applying about 1.4 times voltage value of the alternating voltage so as to electrically discharge. In order to obtain the effects, 0.2 times or more per one second is desirable, and more desirably, it is preferable to electrically discharge one time or more per one second.

Figure 11:
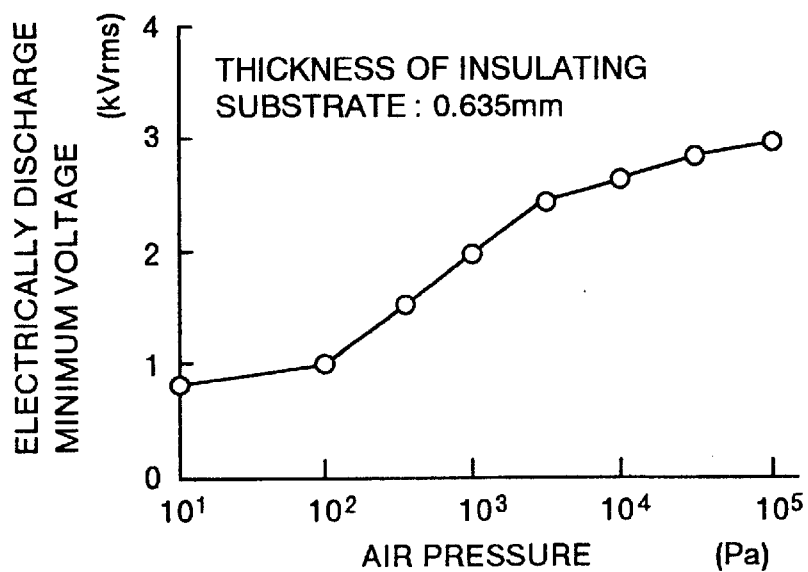
FIG. 11 is a view which shows a relation between an air pressure and a minimum voltage for the electric discharge.

FIG. 11 shows a relation between an air pressure and a minimum electric discharge voltage in the case of applying the voltage in the atmospheric air and the pressure reduced gas so as to electrically discharge. In the case that the thickness of the insulating substrate is 0.635 mm, the electric discharge is generated at about 2 kV under the reduced pressure, for example under 1000 Pa, however, in the atmospheric air ($1.013 \times 10^5$ Pa), the electric discharge is generated only at about 3 kV or more.

Figure 12:
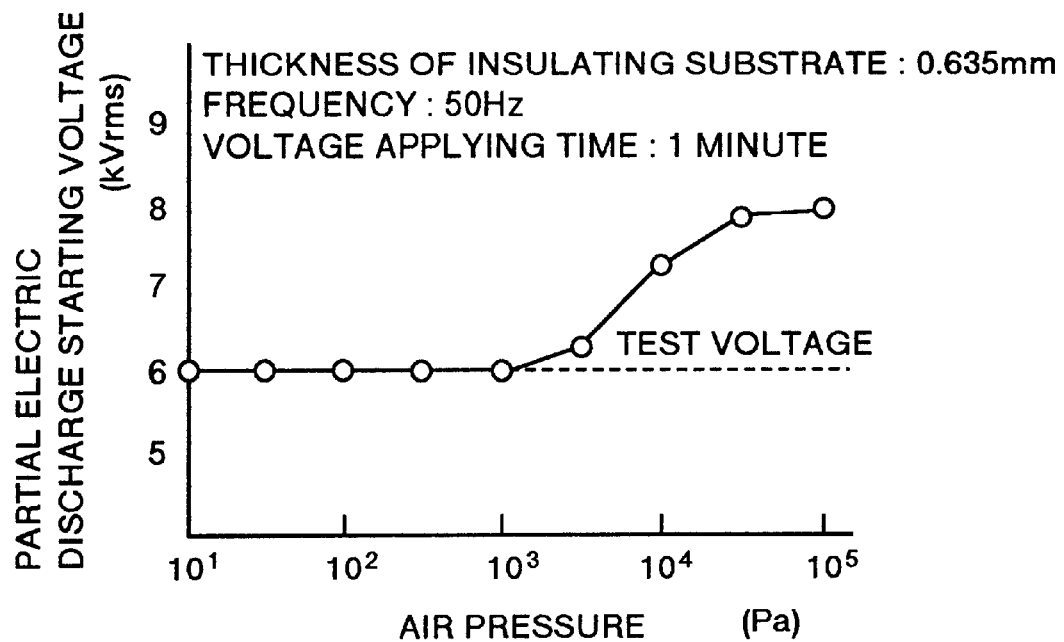
FIG. 12 is a view which shows a relation between an air pressure and an effect by the electric discharge (the partial electric discharge starting voltage)

FIG. 12 shows the air pressure and an effect obtained by the electric discharge (the partial electric discharge starting voltage after assembling in the semiconductor). With reference to FIG. 12, the effect is great in the atmospheric air but small under the reduced pressure. Because the electric discharge aspect moves to an area of a low electric current glow discharge under the reduced pressure. Accordingly, $10^3$ Pa or more is desirable for a range of the air pressure, and more desirably, from $10^4$ Pa to the atmospheric pressure is preferable.

Further, an air, a nitrogen, an argon and the like can be listed up for the used gas. Since the surface of the plating 7 is oxidized due to the heat generated by the electric discharge, it is desirable to treat under the inert gas such as the argon or the like, however, in the case of treating under the air, a treating time (a time for applying the voltage onto the circuit pattern) may be set to be 10 minutes or less.

FIG. 13 shows a relation between a voltage, a current and a treating time (a voltage applying time) which are applied to the circuit pattern on the insulating circuit board in accordance with the present invention, and the effect thereof. FIG. 13A shows a relation between the voltage applied to the circuit pattern and the partial electric discharge starting voltage. When increasing the voltage applied to the circuit pattern, the electric discharge frequency is increased and thus the end portion of the conductor electrode becomes easily melted, such that the effect is increased and the partial electric discharge starting voltage is improved. In FIGS. 13A–13C, there is shown the results obtained under the condition that the thickness of the insulating circuit board is 0.635 mm and under the atmospheric air. In this case, the electric discharge is generated when the voltage is 3 kV or more, and the effect is increased according to the increase of the voltage. In this case, as is shown in FIG. 11, the electric discharge is generated from about 1 kV under the reduced pressure, and the effect is increased in accordance with the increase of the voltage in the same manner. However, at a level over 8 kV, there is a case that a damage is applied to the insulating substrate. Accordingly, the value of the voltage applied to the circuit pattern is desirably in a range between 1 kV and 8 kV.

Next, FIG. 13B shows a relation between the electric discharge current and the partial electric discharge starting voltage. When reducing the circuit resistance and increasing the electric discharge current, the effect is increased. However, when excessively increasing the electric discharge current, the creepage portion of the substrate is inversely carbonized by the electric discharge, so that the effect can not be obtained. Accordingly, it is desirable that the value of the resistance inserted to the circuit pattern in series is within a range between 1 k$\Omega$ and 10 M$\Omega$.

FIG. 13C shows a relation between the treating time (the voltage applying time) and the effect thereof. As shown in FIG. 13C, the longer the treating time is, the higher the effect can be obtained. However, when the treating time is increased to a certain degree, the projection shapes 11$a$ and 11$b$ are reduced (namely, in smooth) and the effect is saturated. Further, when the treating time becomes longer, the surface of the conductor electrode is oxidized under the air and a solder wetting property is lowered. Accordingly, the treating time is desirably set to be 10 minutes or less, preferably, about 1 to 5 minutes. However, in the case of using the inert gas, since it is possible to prevent the oxidization, this rule can not applied.

Further, in order to melt the end portion of the conductor electrode, in addition to utilizing the electric discharge energy, it is possible to irradiate a laser beam so that the end portion of the conductor electrode is melted and re-solidified due to the energy thereof. As a laser to be used, there can be listed up a carbon dioxide ($CO_2$) gas laser, a YAG laser, an excimer laser or the like. Some hundreds watt of laser output is sufficient for melting only the end portion of the conductor electrode, and the laser is irradiated to the end portion of the conductor electrode so that an energy density becomes $10^5$ W/cm$^2$ or less. When the energy density becomes higher than $10^6$ W/cm$^2$, the melted conductor is sputtered, thereby giving a bad influence to the insulating substrate. Further, in the case that the circuit pattern is largely oxidized due to the melting by the laser beam, it is possible to shield by the inert gas so as to prevent the oxidization.

As mentioned above, it is possible to smoothen the projection shape of the end portion of the conductor electrode and restrict the concentration of the electric field so as to increase the partial electric discharge starting voltage, whereby it is possible to provide the insulating circuit board having a high insulating reliability and the power semiconductor apparatus employing the same. When the thickness of the insulating substrate and the creepage distance are increased as occasion demands, it is possible to further increase the withstand voltage.

In accordance with the present invention, it is possible to smoothen the projection shape of the end portion of the conductor electrode on the insulating circuit board and restrict the concentration of the electric field so as to increase the partial electric discharge starting voltage, so that it is possible to obtain the insulating circuit board having a high insulating reliability and the power semiconductor apparatus employing the same.

What is claimed is:

1. A method of manufacturing an insulating circuit board, comprising the step of:

applying a voltage to a circuit pattern provided on an insulating substrate so as to form an insulating circuit board, the voltage being applied to the circuit pattern in an atmospheric or depressurized gas so as to allow a conductor end portion of the circuit pattern to discharge electricity for melting and re-solidifying the conductor end portion of the circuit pattern so as to manufacture the insulating circuit board.

2. The method of claim 1, wherein the melting and re-solidifying of the conductor end portion of the circuit pattern enables a substantially smooth surface for the conductor end portion of the circuit pattern.

3. A method of manufacturing an insulating circuit board, comprising the steps of:

bonding an electrode conductor to a surface of an insulating substrate by a bonding member so as to form a circuit pattern on the surface of the insulating substrate and to form an insulating circuit board, and applying a voltage to the circuit pattern in an atmospheric or depressurized gas so as to allow a conductor end portion of the circuit pattern to discharge electricity for melting and re-solidifying the conductor end portion of the circuit pattern so as to manufacture the insulating circuit board.

4. The method of claim 3, wherein said conductor end portion is re-solidified so as to have a curvature radius of 3 μm or more in a cross section of the insulating circuit board.

5. The method of claim 3, wherein said conductor end portion is re-solidified so as to have a difference of 50 μm or less between a cape and a recess of said conductor end portion as viewed from the top of the insulating circuit board.

6. The method of claim 3, wherein an alternating voltage or a direct voltage being lower than a test voltage is applied to the circuit pattern so as to allow the conductor end portion to discharge electricity.

7. The method of claim 3, wherein an alternating voltage is applied to the circuit pattern so as to allow the conductor end portion to discharge electricity substantially every cycle.

8. The method of claim 3, wherein a direct voltage is applied to the circuit pattern so as to allow the conductor end portion to discharge electricity one or more times per second.

9. The method of claim 3, wherein an alternating voltage or a direct voltage is applied to the circuit pattern by using a circuit having a resistance connected to the circuit pattern in series so as to allow the conductor end portion to discharge electricity.

10. The method of claim 9, wherein a value of the resistance connected to the circuit pattern in series is within a range between 1 kΩ and 10 MΩ.

11. The method of claim 2, wherein a value of the voltage applied to the circuit pattern is within a range between 1 kV and 8 kV.

12. A power semiconductor apparatus manufactured by utilizing the method of claim 3.

13. The method of claim 3, wherein the melting and re-solidifying of the conductor end portion of the circuit pattern enables a substantially smooth surface for the conductor end portion of the circuit pattern.

14. A method of manufacturing an insulating circuit board, comprising the steps of:

bonding an electrode conductor to a surface of an insulating substrate by a bonding member so as to form a circuit pattern on the surface of the insulating substrate so as to form an insulating circuit board, and applying a laser beam to the circuit pattern for melting and re-solidifying a conductor end portion of the circuit pattern so as to manufacture the insulating circuit board.

15. The method of claim 14, wherein said conductor end portion is re-solidified so as to have a curvature radius of 3 μm or more in a cross section of the insulating circuit board.

16. The method of claim 14, wherein said conductor end portion is re-solidified so as to have a difference of 50 μm or less between a cape and a recess of said conductor end portion as viewed from the top of the insulating circuit board.

17. The method of claim 14, wherein the melting and re-solidifying of the conductor end portion of the circuit pattern enables a substantially smooth surface for the conductor end portion of the circuit pattern.

18. An insulating circuit board having an insulating substrate, and an electrode conductor bonded to a surface of the insulating substrate by a bonding member to form a circuit pattern on the surface of the insulating substrate so as to form the insulating circuit board, wherein a conductor end portion of the circuit pattern has a curvature radius of 3 μm or more in a cross section of the insulating circuit board.

19. A power semiconductor apparatus using the insulating circuit board of claim 18.

20. The insulating circuit board of claim 18, wherein the conductor end portion of the circuit pattern has a substantially smooth surface as viewed from the top of the insulating circuit board.

21. An insulating circuit board having an insulating substrate, and an electrode conductor bonded to a surface of the insulating substrate by a bonding member to form a circuit pattern on the surface of the insulating substrate so as to form the insulating circuit board, wherein a conductor end portion of the circuit pattern has a difference of 50 μm or less between a cape and a recess of said conductor end portion as viewed from the top of the insulating circuit board.

22. A power semiconductor apparatus using the insulating circuit board of claim 21.

23. The insulating circuit board of claim 21, wherein the conductor end portion of the circuit pattern has a substantially smooth surface as viewed from the top of the insulating circuit board.

* * * * *